US010700703B2

(12) United States Patent
Khan et al.

(10) Patent No.: US 10,700,703 B2
(45) Date of Patent: Jun. 30, 2020

(54) DYNAMIC RELIABILITY LEVELS FOR STORAGE DEVICES

(71) Applicant: Intel Corporation, Santa Clara, CA (US)

(72) Inventors: Jawad B. Khan, Portland, OR (US); Sanjeev N. Trika, Portland, OR (US); Omesh Tickoo, Portland, OR (US); Wei Wu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 16/022,631

(22) Filed: Jun. 28, 2018

(65) Prior Publication Data

US 2019/0044536 A1 Feb. 7, 2019

(51) Int. Cl.
*H03M 13/00* (2006.01)
*H03M 13/05* (2006.01)
*G06F 11/10* (2006.01)

(52) U.S. Cl.
CPC ......... *H03M 13/05* (2013.01); *G06F 11/1044* (2013.01); *G06F 11/1048* (2013.01); *H03M 13/611* (2013.01)

(58) Field of Classification Search
None
See application file for complete search history.

(56) References Cited

U.S. PATENT DOCUMENTS

2016/0259577 A1* 9/2016 Park .................. G11C 16/0466
2018/0219561 A1* 8/2018 Litsyn ............... H03M 13/2909
2019/0243772 A1* 8/2019 Roberts ................ G06F 3/0619

OTHER PUBLICATIONS

Jevdjic et al "Approximate Storage of Compressed and Encrypted Videos", ASPLOS'17, Proceedings of the Twenty-Second International Conference on Architectural Support for Programming Languages and Operating Systems, pp. 361-373, Xi'An China, Apr. 8-12, 2017.
Sampson, Adrian "Approximate Storage in Solid-State Memories", MICRO'46, Dec. 7-11, 2013, Davis, CA., 12 pages.
Guo, et al., "High-Density Image Storage Using Approximate Memory Cells", Proceedings of the International Conference on Architectural Support for Programming Languages and Operating Systems (ASPLOS), 2016.
H. Hoppe, "Progressive Meshes", Proceedings of Computer Graphics (SIGGRAPH) 1996, pp. 99-108.

* cited by examiner

*Primary Examiner* — Mujtaba M Chaudry
(74) *Attorney, Agent, or Firm* — Compass IP Law PC

(57) ABSTRACT

To address the storage needs of applications that work with noisy data (e.g. image, sound, video data), where errors can be tolerated to a certain extent and performance is more critical than data fidelity, dynamic reliability levels enable storage devices capable of storing and retrieving data with varying degrees of data fidelity to dynamically change the degree of data fidelity in response to an application's request specifying reliability level. By allowing the application to specify the reliability level at which its data is stored and retrieved, dynamic reliability levels can increase read/write performance without sacrificing application accuracy. The application can specify reliability levels for different types or units of data, such as different reliability levels for metadata as opposed to data and so forth.

13 Claims, 10 Drawing Sheets

DYNAMIC RELIABILITY LEVELS FOR STORAGE DEVICES

TECHNICAL FIELD

The technical field relates generally to computer storage and, in particular, to error management for data storage devices.

BACKGROUND ART

Non-volatile memories such as NAND (not AND) and 3D-NAND flash memory and three dimensional (3D) cross point memory, etc., are prone to hard and soft errors that result in data retrieved from memory that is different from the data stored in memory. To overcome this problem storage devices, such as solid-state drives (SSD), are equipped with technology that goes to extreme lengths to make sure that the data being stored in and retrieved from the device is correct.

For example, many storage device manufacturers equip SSDs with a monitoring technology for detecting and reporting indicators of device reliability. Examples of commonly used indicators include reallocation sectors count, reported uncorrectable errors, power-on hours, read-write errors, etc.

As another example, many storage device manufacturers provide storage protection mechanisms that enable the recovery of data in the event of a data storage failure. On storage protection mechanism is an error control coding (ECC) protection scheme in which data is encoded in memory using storage redundancies that protect and ensure the reliability of stored data.

The use of monitoring and data protection schemes increase the expense of storage and can impact performance as well. However, not all applications need completely error-free storage. For example, applications that work with noisy data (e.g. image, sound, video data) can tolerate errors to a large extent and performance can be more critical than data fidelity.

BRIEF DESCRIPTION OF THE DRAWINGS

The described embodiments are illustrated by way of example and not limitation in the figures of the accompanying drawings, in which like references indicate similar elements and in which.

Figure 1:
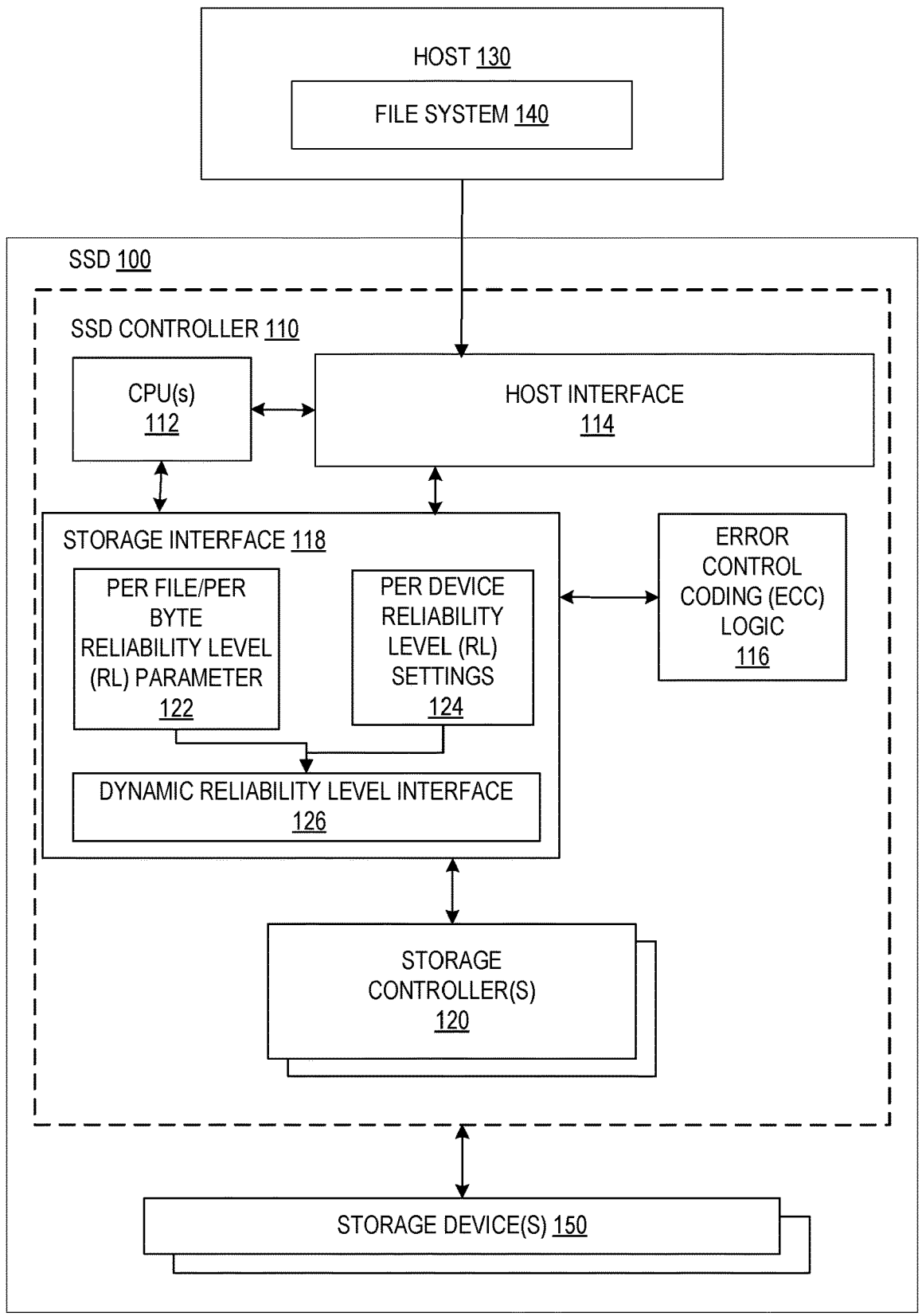
FIG. 1 is a schematic, block diagram illustration of components of apparatus to implement dynamic reliability levels for non-volatile memory in accordance with various examples described herein.

Other features of the described embodiments will be apparent from the accompanying drawings and from the detailed description that follows.

DESCRIPTION OF THE EMBODIMENTS

To address the storage needs of applications that work with noisy data (e.g. image, sound, video data), dynamic reliability levels for non-volatile memory as herein described enable a host application to dynamically specify reliability levels to control the varying degrees of data fidelity at which data is stored and retrieved. By allowing the application to dynamically specify the reliability level to control how and/or where its data is stored and retrieved, a storage system can increase read/write performance without sacrificing application accuracy.

For ease of illustration, and by way of example only, the described embodiments of dynamic reliability levels for non-volatile memory can be used to store and retrieve data with varying degrees of data fidelity, including storing data with errors resulting from reduced precision, such as rounding errors introduced at the time the data is stored, or storing data with errors that result from a random or systematic error, such as a physical error introduced by the storage media. However, dynamic reliability levels for non-volatile memory can be used to store and retrieve data with varying degrees of data fidelity as a result of other types of errors, as long as the data storage and retrieval is capable of being controlled with at least two or more different levels of reliability: one level of reliability that is associated with a higher degree of data fidelity and one level that is associated with a lower degree of data fidelity. In a typical embodiment, dynamic reliability levels for non-volatile memory can be used to store and retrieve data with varying degrees of data fidelity that are controllable with several levels of reliability.

One example of storing and retrieving data with varying degrees of data fidelity is the use of storage redundancies that protect and ensure the accuracy of stored data. That is, the data is encoded and stored using more bits as compared to the actual binary representation so that the data can be recovered in the event of a storage failure. The encoding and decoding of data is referred to as an error control coding (ECC) protection scheme. Although encoded data is strengthened and made more resilient to errors using ECC storage redundancies, encoded data often exhibits an error probability, both correctable and uncorrectable. One benefit of using ECC is that it allows data to be read and decoded even in the presence of errors.

With the advent of ECC protection schemes, modern storage devices typically employ heroic measures for mitigating data errors. If, despite the ECC protection scheme, data cannot be read and decoded successfully, a read command will fail and be returned to a host with no data and an indication that a fatal ECC error occurred. In some cases, an ECC fatal error is indicated even if only a single bit in a large block of data (e.g., 512B, 4 KB) is incorrect. This binary behavior of ECC protection schemes, where the memory in which the data is stored returns either correct data or a fatal indication and no data, can be a limitation for many applications.

As already noted, applications that work with noisy data (e.g. image, sound, video data) can tolerate errors to a certain extent, whether those errors are correctable or uncorrectable. For this reason, storage systems that use ECC protection schemes can use different correction levels for encoded data where a correction level permits a certain level of error probability in exchange for higher read/write performance as long as the application's ability to function is not sacrificed.

For example, techniques to reduce the probability of errors while maintaining performance can use the correction levels described herein to alter various tuning parameters used in the ECC algorithms that encode and decode the data, such as altering a code rate, i.e. the number of redundant bits used to encode the data, limiting iterations for decoding to reach an acceptable error rate, setting a threshold for the acceptable error rate, combining different tiers of protection, and the like.

Even with the availability of parameterized tunable ECC protection schemes allowing different correction levels for probabilistic storage, none allow a host application to specify a correction level based on the application's requirements for the data being protected. For example, existing ECC protection schemes cannot be accessed by a host application to manage the different correction levels for encoded data that best meet the application's needs.

Another example of storing and retrieving data with varying degrees of data fidelity is storing and retrieving data approximately by allowing some data to be stored and retrieved with less precision than other data. Storing data with less precision includes truncation of lower bits in floating point data and other inexact methods of storing data. It can also refer to storing data in storage blocks that would otherwise go unused, such as storage blocks or sectors that have reached a certain level of wear that prohibits their use for data that must be stored with greater precision. Reading and writing data stored with less precision can improve performance by reducing the complexity and quantity of data stored and making greater use of existing storage capacity.

Storing and retrieving data with varying degrees of data fidelity can offer significant advantages in terms of the cost of data stored. Data that is amenable to being stored with reduced precision or less accuracy is typically multimedia data, such as videos, images, and audio, where latency of data retrieval and use can be more important than data reliability. However, even in multimedia data there are elements of the data that cannot be compromised, such as file-metadata, reference frames, etc. of a video file. Existing storage technologies cannot ensure that, within the same file, the reliability of such data is not compromised, even while the rest of the data may be stored and retrieved with less precision or less accuracy.

Efforts to address the dual requirements for data reliability in multimedia files include techniques for storing progressive images using approximation levels in which a first (low-resolution) version of an image is approximately (or, by default, exactly) stored and returned with high precision while subsequent deltas are approximately stored and returned with reduced precision. This ensures that the data that has the most impact on the image quality, i.e. the first version of the image, is stored and retrieved with highest precision. A similar technique extends the first-high/subsequent-reduced precision storage to video data. However, such techniques are specific to the image/video media domains and do not allow a host application to manage approximation levels to vary the precision with which its data is stored, either in whole or in part.

For example, because of the nature of the data, multi-resolution-meshes (MRMs) and audio data would require the application of techniques different from the above-described first-high/subsequent-reduced precision storage to achieve a similar result as achieved for progressive images and video. Addressing the dual requirements for data reliability is further complicated since different formats exist even within a single data-type. For example, video images may be stored in MPEG4, AVI and other formats, and each different format requires its own custom logic to determine which portions of data require high (or exact) precision and which portions can be approximately stored and retrieved with less precision.

Since multiple media/data types are typically required to be saved on the same storage system, a single scheme for storing and retrieving data with varying precision cannot be applied globally. The above-described practical considerations make construction of a generic approach to storing and retrieving data with varying precision difficult.

In view of the above challenges, for applications that work with noisy data and can tolerate errors (e.g. image, sound, video data applications) to take advantage of less reliable storage, such as storing and retrieving data with less precision or less accuracy, embodiments of dynamic reliability levels for data stored in non-volatile memory as herein described enable a host application to control a level of reliability at which its data is stored in and retrieved, including specifying a reliability level for all or a portion of data.

In one embodiment, the data, including the portion of data for which the host/application can specify reliability levels, can be one or more units of data, including any one or more bytes of data, data fields, metadata, records, files and the like. The host/application can specify the reliability level on a per command basis, such as in a file system request issued to the underlying storage system, including in any one or more of a file system request to read, write or otherwise store or access such data in storage controlled by a storage controller of the storage system.

In one embodiment, upon receiving from a host application a file system request specifying a reliability level, a storage controller having a dynamic reliability level interface converts the reliability level into a corresponding degree of data fidelity at which the host's data (or portion of data) can be stored and retrieved. For example, the dynamic reliability level interface converts the host-specified reliability level into a correction level for controlling the error probability exhibited by data stored using an ECC protection scheme. As another example, the dynamic reliability level interface converts the host-specified reliability level into an approximation level for controlling the precision with which data is stored, including whether the data is truncated or otherwise stored inexactly and/or whether the data is stored in media that is more prone to physical errors, such as worn sectors, or in media that is less prone to such errors, such as newer sectors.

In one embodiment, a host-specified reliability level can be converted into the any one or more correction and approximation levels based on the availability of storage devices capable of storing and retrieving data with varying degrees of data fidelity. The availability of correction and approximation levels to control a level of reliability with which data can be stored and retrieved is exposed to a host/application through storage and file systems in cooperation with the dynamic reliability level interface.

In one embodiment, a host-specified reliability level can be converted into the any one or more correction and approximation levels based on a mapping between the two or more reliability levels and the available degrees of data fidelity for storing and retrieving data in one or more storage devices under the control of the storage controller. The mapping can be configured for a storage system in advance or generated based on the type and availability of storage devices and/or other operational considerations.

In one embodiment, the storage and file systems are extended to provide a reliability level (RL) parameter for a host application to pass a specified RL in a file system request, such as in a fRead and fWrite command. The dynamic reliability level interface converts the RL parameter value to one or more of an approximation level and/or correction level as appropriate to store data with varying degrees of data fidelity that correspond to the host-specified RL.

In one embodiment, the host application can use the reliability level parameter to specify the requested reliability level at a byte-range level of granularity, i.e. for one or more bytes of data. In one embodiment, the host application can use the reliability level parameter to specify the requested reliability level at a sector level granularity, i.e. for one or more sectors in which the data is to be stored. By way of example only and not limitation, a default value for the reliability level parameter can be "0" to specify that the data written and read must be exact, ensuring backwards capability with storage systems that do not support storage devices capable of storing data with varying degrees of data fidelity.

In one embodiment a high reliability level can be converted to an approximation level causing a storage controller to approximately store data in a storage device at higher precision with likely lower performance, and a low reliability level can be converted to an approximation level causing a storage controller to approximately store data in a storage device at lower precision with likely higher performance. In one embodiment precision can refer to whether the data is stored with less precision due, for example, to a mathematical rounding error resulting from truncation of the lower bits of a floating point number. Alternatively, or in addition, in one embodiment precision can refer to whether the data is stored in media that is more prone to introducing physical errors or less prone to introducing physical errors.

In one embodiment, a high reliability level specified by a host application can be converted to a correction level that causes a storage device to store and retrieve data using an ECC protection scheme tuned for greater error correction/lower error probability, but likely with lower performance, and a low reliability level can be converted to a correction level that causes a storage device to use an ECC protection scheme tuned for lower error correction/higher error probability, but likely with greater performance.

In one embodiment, a default reliability level can be applied to file system requests that have not specified a reliability level. For example, a default reliability level can be set globally on a storage device or storage system using vendor-specific set features commands and the like. In one embodiment, a default reliability level can be applied on a per command level, e.g., a default level for all write commands for a storage system. Alternatively, or in addition, a specified or default reliability level can be overridden based on operating characteristics of the storage system, such as during periods of high resource usage or other factors impacting the performance of the storage system.

In one embodiment, in a storage system capable of storing data with varying degrees of data fidelity, a host application can specify a reliability level at a sector level of granularity and a default value, such as "0," is used to specify that the data written and read must be exact, not approximate, ensuring backwards capability for applications that need their data to be stored exactly, and/or storage systems that do not support storing data with varying degrees of data fidelity. The minimum and maximum values for the approximation level may be implementation dependent. The storage system may employ a variety of techniques to store data with greater or lesser precision based on an approximation level, including but not limited to selecting the storage device in which data is stored based on media reliability and/or the available level of lossless/lossy compression. For example, media reliability selections for NAND flash memory include single level cell (SLC) vs. multi-level cell (MLC) vs. triple-level cell (TLC) vs. quadruple-level cell (QLC), where SLC is generally more reliable but costs more than MLC, TLC and QLC, and so forth.

In one embodiment, a storage system capable of storing data with varying levels of data fidelity is also extended to provide a command to query an approximation level of any given sector(s) of one or more storage devices, where the sectors may include some sectors that are more prone to introducing errors and those that are less prone to introducing errors. For example, a query may specify multiple sectors and returns the minimum approximation level of all the specified sectors.

In one embodiment, a maximum value for an approximation level into which a reliability level is converted for storing data with more or less precision may be implementation dependent. Further, since a host application may specify different reliability levels that correspond to different approximation levels for data within a single sector, a storage system supporting storing and retrieving data with more or less precision can be extended to use a minimum approximation level value of all data comprising that sector when requesting the storage system to write the data. Thus, in one embodiment, a file system and/or storage system is extended to determine the minimum approximation level by tracking the minimum approximation level for all sectors for which the approximation level is not zero, i.e. all sectors in which data is stored approximately instead of exactly. For example, the file system may employ a hash-table having entries for each sector and the current approximation level for the sector. In one embodiment, the file system is extended to query the storage system for the current approximation level for one or more sectors to determine the minimum approximation level for those sectors.

In one embodiment, a host application is extended to specify a reliability level for data being read or written, with different levels specified for portions of the application's data. For example, a video-file-writer application may specify the highest reliability level for video metadata and reference frames to ensure that the data is exactly stored at the highest precision level, e.g. with an approximation level of "0," but gradually relaxing the reliability level for dependent frames in sequence such that the data is approximately stored with lower precision levels, e.g., an approximation level of "2."

In one embodiment, the host application can include an arbitrary media-type and format serializer to aid the application in determining and specifying which portion(s) of the application's data should be stored at greater reliability levels and which portion(s) of its data can be stored at lower reliability levels. In some scenarios, the file system operates in conjunction with the underlying storage system to determine the appropriate reliability levels for the data or portion of data associated with the host/application's file system request while factoring into the determination the host application-specified reliability level. For example, in some scenarios the file system determines the reliability level when the application's specified reliability level is unavailable due to operating conditions or other quality of service (QoS) considerations or, in the case of storing data with more or less precision, due to the minimum approximation level available for those sectors in which the requested data is approximately stored.

In one embodiment, a storage system capable of storing data with varying degrees of data fidelity is extended to return requested data to a host/application even in the presence of errors, including transmitting, via the dynamic reliability level interface and the file system, the data containing the errors. In addition, in one embodiment, a storage system capable of providing varying degrees of data fidelity is extended to provide an estimate of the number of correct bits in the returned data.

In one embodiment, the estimated number of correct bits in the returned data is derived based on the number of remaining errors identified during an error correction coding (ECC) process, where the number of remaining errors is determined based on the number of errors that remain in an incorrect codeword of encoded data identified during the ECC process. In one embodiment, estimating the number of remaining errors changes depending on the type of ECC protection scheme used to provide varying degrees of data fidelity and/or the correction level at which the ECC protection scheme is performed.

In one embodiment, extending the storage system to return the requested data containing the errors to the host/application provides feedback that enables a host application to tailor future requests to improve its operation. For example, a host application issuing file system requests specifying a reliability level that result in a greater volume of errors than the application can tolerate alerts the host application to specify higher reliability levels for future requests to improve data accuracy. Conversely, a host application issuing file system requests specifying a reliability level that result in a lower volume of errors than the application can tolerate alerts the host application to specify lower reliability levels for future requests to improve performance. In this manner, allowing host applications to specify reliability levels in file system requests and receive feedback therefrom enable the host application to self-correct as needed for optimal operation while improving overall efficiency in the use of storage system capacity.

In one embodiment, dynamic reliability levels for data stored in non-volatile memory can be enabled with an interface between a host and a storage system, referred to herein as the dynamic reliability level interface. For example, the dynamic reliability level interface can extend the functionality of an existing file system interface to an underlying storage system to expose the dynamic reliability capabilities of the non-volatile storage, i.e. the varying degrees of data fidelity at which data can be stored and retrieved. The dynamic reliability level interface exposes the dynamic reliability capabilities of non-volatile storage including storage devices capable of storing and retrieving data with more or less accuracy and/or precision.

In the description that follows, examples may include subject matter such as a method, a process, a means for performing acts of the method or process, an apparatus, a storage device, a system, and at least one machine-readable tangible storage medium including instructions that, when performed by a machine or processor, cause the machine or processor to performs acts of the method or process according to embodiments and examples of dynamic reliability levels for storing data in non-volatile memory as described herein.

Numerous specific details are set forth to provide a thorough explanation of embodiments of the methods, media and systems for providing dynamic reliability levels for storing data in non-volatile memory. It will be apparent, however, to one skilled in the art, that an embodiment can be practiced without one or more of these specific details. In other instances, well-known components, structures, and techniques have not been shown in detail so as to not obscure the understanding of this description.

Reference in the specification to "one embodiment" or "an embodiment" means that a particular feature, structure, or characteristic described in connection with the embodiment can be included in at least one embodiment. The appearances of the phrase "in one embodiment" in various places in the specification do not necessarily all refer to the same embodiment.

The methods, processes and logic depicted in the figures that follow can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic are described below in terms of some sequential operations, it should be appreciated that some of the operations described can be performed in a different order. Moreover, some operations can be performed in parallel rather than sequentially.

In any one or more of the embodiments of the systems, apparatuses and methods herein described, dynamic reliability levels for storing data in non-volatile memory includes a storage device in which data is capable of being stored and retrieved with varying degrees of data fidelity, a controller and an interface to a file system for exposing to a host the varying degrees of data fidelity in a plurality of levels of reliability. In one embodiment, an application operating on the host in communication with the file system specifies through the interface any one or more of the plurality of levels of reliability with which the application's data should be stored and retrieved.

In one embodiment, a storage device capable of storing and retrieving data with any one or more of the plurality of levels of reliability includes a device capable of storing and retrieving data with more or less precision, and/or a device capable of storing and retrieving data with more or less accuracy.

In one embodiment, the plurality of levels of reliability for storing data with more or less precision is represented in a corresponding plurality of approximation levels, including a minimum approximation level for storing data in one or more locations in a storage device with reduced precision and a default approximation level for storing data with exact precision. For example, a minimum approximation level of 2 could be used to indicate that data can be stored in blocks that have reached a certain level of wear resulting in less reliable storage (i.e., for storing data with reduced precision), and a maximum approximation level of 5 for data stored in least reliable storage (i.e. blocks for storing data with the least amount of precision). In one embodiment, all sectors of a storage device have a default approximation level. For example, a default approximation level might be indicated with a level of 0 for data to be stored in the most reliable blocks of a storage device, i.e., with exact precision. In one embodiment, the corresponding plurality of approximation levels includes any one or more approximation levels for storing data with more or less computational precision, such as truncating one or more lower order bits of data representing a floating point number.

In one embodiment, the plurality of levels of reliability for storing data with more or less accuracy is represented in a corresponding plurality of correction levels, each correction level associated with an error probability exhibited by stored data that is encoded and decoded using error control coding (ECC) protection. Higher correction levels are generally associated with more accurate data having lower error probabilities and lower correction levels are generally associated with less accurate data having higher error probabilities. In one embodiment a default correction level is generally the highest available correction level associated with a zero or near zero error probability for the most accurate data having a fully correctable bit error rate.

In an example correction level hierarchy, a lower correction level might be indicated with a level of 0 for an ECC protection scheme tuned to allow encoded data to be stored and retrieved with the least amount of correction and therefore a greater probability of errors, and a higher correction level might be indicated with a level of 4 or greater for an ECC protection scheme tuned to allow encoded data to be stored and retrieved with the greatest amount of correction and therefore with a lower probability of errors.

An example of the various layers of ECC protection afforded in SSDs in general is shown in Table 1 below. The lowest level of protection is basic Media ECC with Hard LDPC (Low Density Parity Check) correction, Level 0, the minimum correction capability that is typically applied to data stored in an SSD. Moving up the hierarchy, Level 1 through Level 4, more and more bits can be corrected but at the cost of extra overhead in development time and execution time. In some embodiments, the higher levels can achieve data parity between the PCIe (Peripheral Component Internet-Express interface) and SSD Controller for host data bytes ranging from 512, 520, 528, 4096, 4224, 4104 through 4112.

TABLE 1

General Levels of Correction for SSD

| Level 0 | NAN D ECC - LDPC (correction using hard LDPC) |
| Level 1 | NAN D ECC - LDPC (correction using soft LDPC) |
| Level 2 | NAN D ECC - LDPC (correction using soft and corrective read LDPC) |
| Level 3 | Moving Read References (MRR) NAND re-read (hard and soft read for LDPC) |
| Level 4 | XOR: Page level XOR over several NAND dies |

Regardless of whether a host-specified reliability level is converted to an approximation level for storing data with more or less precision, and/or converted to a correction level for storing data with more or less accuracy, the level indicators as described herein, level 0 through 3 or 4, etc., are by way of illustration only, and embodiments of dynamic reliability levels in non-volatile memory can use other types indicators and ranges of indicators to represent any of a reliability level, approximation level and correction level.

Turning now to FIG. 1, a schematic block diagram illustrates components of an apparatus for implementing dynamic reliability levels in a storage device, such as a solid-state drive (SSD) in accordance with various examples described herein. Referring to FIG. 1, in some embodiments an SSD 100 comprises an SSD controller 110 coupled to one or more central processing units (CPUs) 112 and a storage interface 118. The storage interface 118 interoperates with one or more storage controllers 120 controlling a respective one or more storage devices 150, at least one of which is capable of storing and retrieving data with varying degrees of data fidelity, including more or less accurately and/or with more or less precision. In one embodiment, the storage devices 150 include at least one which is capable of storing data encoded and decoded using an error control coding (ECC) logic 116 of SSD controller 110.

The storage interface 118 includes a dynamic reliability level interface 126 that exposes one or more reliability level parameters 122 used by a host 130 to specify a value for the parameters via the host's file system 140 and the SSD controller's corresponding host interface 114. The dynamic reliability level interface 126 includes logic for handling one or more per file and/or per byte reliability level (RL) parameters 122 specified by the host 130 and one or more per device reliability level (RL) settings 124 as will be described in further detail below. In one embodiment, the one or more storage device(s) 150 may be implemented using non-volatile memory. In various embodiments, at least one of the storage devices 150 is a block-addressable memory device, such as those based on NAND or NOR technologies. In one embodiment, the non-volatile memory may be byte or block-addressable. The specific configuration of the storage device(s) 150 controlled by SSD controller 110 in SSD 100 is not critical.

A storage device 150 may also include future generation non-volatile devices, such as a three-dimensional (3D) crosspoint memory device, or other byte addressable write-in-place non-volatile memory storage devices. In some embodiments, 3D crosspoint memory may comprise a transistor-less stackable cross point architecture in which memory cells sit at the intersection of word lines and bit lines and are individually addressable, and in which bit storage is based on a change in bulk resistance.

In one embodiment, at least one storage device 150 may be or may include memory storage devices that use chalcogenide glass, multi-threshold level NAND flash memory, NOR flash memory, single or multi-level Phase Change Memory (PCM), a resistive memory, nanowire memory, ferroelectric random-access memory (FeRAM), ferroelectric transistor random access memory (FeTRAM), anti-ferroelectric memory, nanowire-based non-volatile memory, and other types of persistent memory that incorporates memristor technology, magnetoresistive random access memory (MRAM) memory that incorporates memristor technology, resistive memory including the metal oxide base, the oxygen vacancy base and the conductive bridge Random Access Memory (CB-RAM), spin-transfer torque memory (STT-RAM) or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor RAM-based memory device, or a combination of any of the above, or other memory. The memory device may refer to the die itself and/or to a packaged memory product.

Figure 2:
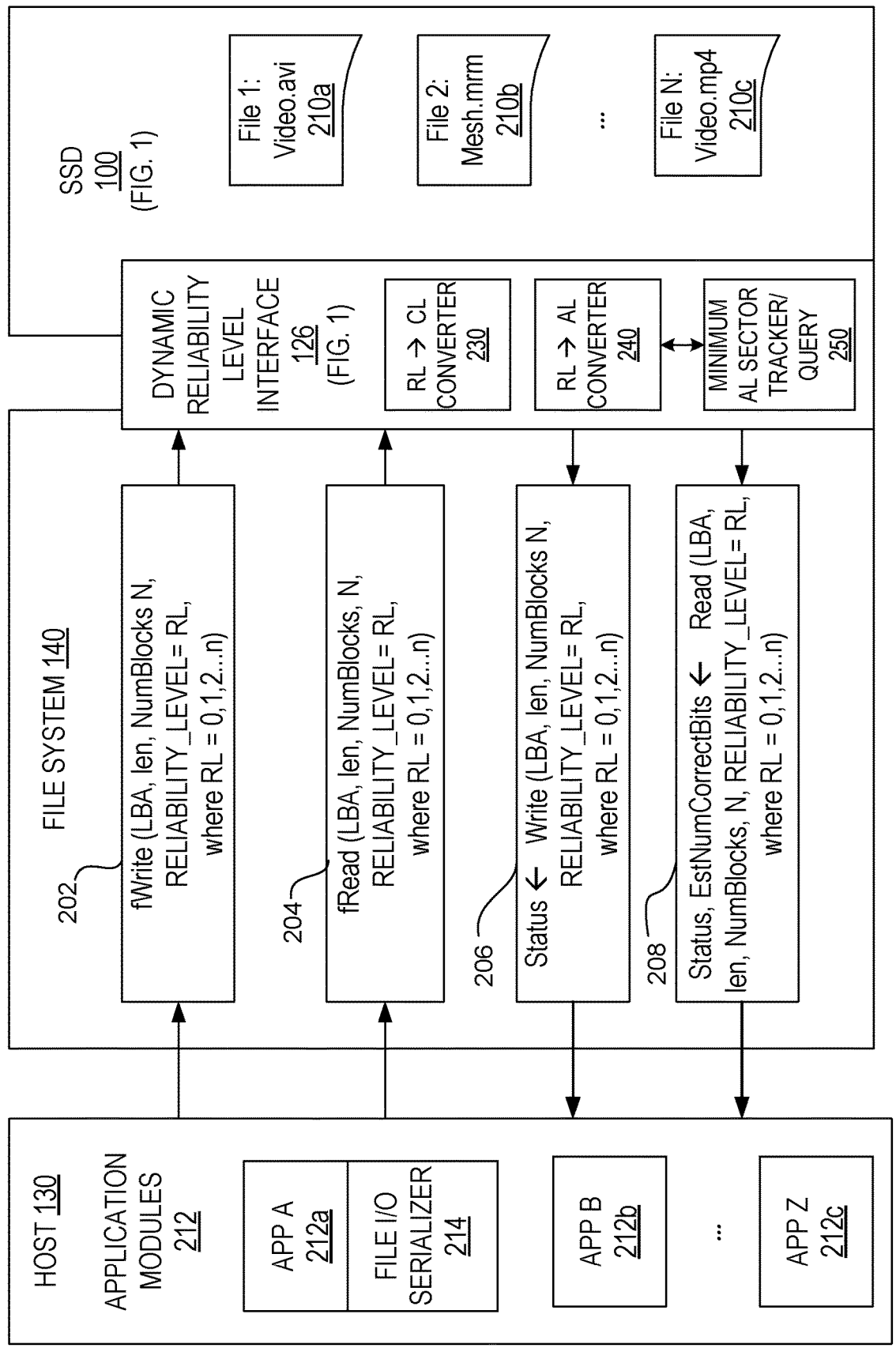
FIG. 2 is a schematic, block diagram illustration of an overview of a system to implement dynamic reliability levels for non-volatile memory in accordance with various examples described herein.

FIG. 2 is a schematic block diagram illustration of further details of components of an apparatus for implementing dynamic reliability levels in non-volatile memory in accordance with various examples discussed herein. The storage system or SSD 100 is coupled to the file system 140, both of which interface with the dynamic reliability level interface 126.

In a typical operating scenario, the file system 140 receives from a host 130 application module 212, such as App A 212a, App B 212b, . . . , App Z 212c, a file system request, such as an fWrite 202 request and an fRead request 204. Upon receipt, the file system 140 processes the requests and causes the storage system/SSD 100 to satisfy the request. Upon satisfying the request, the file system 140 transmits back to the requesting host application module 212/212a/212b/212c a return message 206/208, including a status for the previously received requests 202/204, and other information about the requested data, such as the logical block address (LB A), the length of the data, and the number of blocks of data (NumBlocks N).

Pertinent to the embodiments described herein, the requests 202/204 and return messages 206/208 include a reliability level (RL) containing the RL specified by the application module 212 operating on the host 130 or, upon return, containing the RL which the underlying storage system SSD 100 was able to provide, accompanied by the status of the request as will be described in further detail below.

In one embodiment, the dynamic reliability level interface 126 includes logic for an RL→CL converter 230, for converting a requested RL from the host/application 212 into a corresponding correction level (CL) at which the requested data can be stored with the requested degree of accuracy, i.e. with the requested level of correction for the ECC scheme being used.

In one embodiment, the dynamic reliability level interface 126 also includes logic for an RL→AL converter 240, for converting a requested RL from the host/application 212 into a corresponding approximation level (AL) at which the requested data can be stored in approximate storage.

By way of example only and not limitation, a default AL can be indicated with a "0," to specify that the data written and read must be exact, ensuring backwards compatibility. In one embodiment, the minimum and maximum AL may be implementation dependent.

In one embodiment, the dynamic reliability level interface 126 includes logic for a minimum AL Sector Tracker/Query 250 in which the minimum AL that is available for a particular sector of a storage device is tracked and queried as needed by the dynamic reliability level interface 126 to ensure that the host application 212 does not attempt to cause the storage system/SSD 100 to store the requested data at an AL below the minimum AL available for that storage device.

In one embodiment, the minimum AL for a sector depends on the ALs of the data that has already been written. For example, if data has already been written with an AL of 2 representing a certain level of storage precision, then subsequent requests for storing and retrieving data in that sector must use the AL of 2 as the minimum allowable level of storage precision, i.e. the minimum AL, even if the host specified that data can be stored with less precision, such as a host-specified RL that converts to a higher AL of 3). Of course, subsequent requests for more exact storage, such as requests to store data with an RL that converts to an AL of 1, or even to a default AL of 0 for the most exact storage, could supplant the AL of 2 as the minimum AL for that sector.

In one embodiment, once the dynamic reliability level interface 126 has converted the RL to the appropriate AL or CL, then the storage system 100 carries out the storage or retrieval operation in accordance with the converted RL.

In one embodiment, the storage system 100 may choose a variety of techniques to store data based on the AL, including but not limited to media reliability (e.g., SLC vs. MLC vs. TLC vs. QLC), the level of lossless/lossy compression, and truncation of lower order bits for floating point data. In one embodiment, the application may specify different RLs for different portions of data. For example, a video-file-writer 222a with a file I/O serializer 224 may specify an RL that converts to AL=0 (e.g. "exact" storage) for video metadata and reference frames, and gradually increase the RL to convert to higher AL values (less precise storage) for dependent frames in sequence. For example, a mesh-file-writer 222b may specify an RL that converts to an AL=0 (e.g. "exact" storage) for the base mesh or for objects that are close to the viewer, and gradually increase the RL to convert to a higher AL (less precise storage) for higher MRM levels or objects that are further away from the viewer.

By way of example only, and without limitation, in one embodiment, the different RLs specified via the dynamic reliability level interface 126 results in stored files such as File 1, a video.avi file 210a, or File 2, a Mesh.mrm file 210b, or File N, a Video.mp4 file 210c, all potentially stored with varying degrees of data fidelity using their corresponding host/application specified RL and the respective AL or CL to which the RL is converted.

Figure 3:
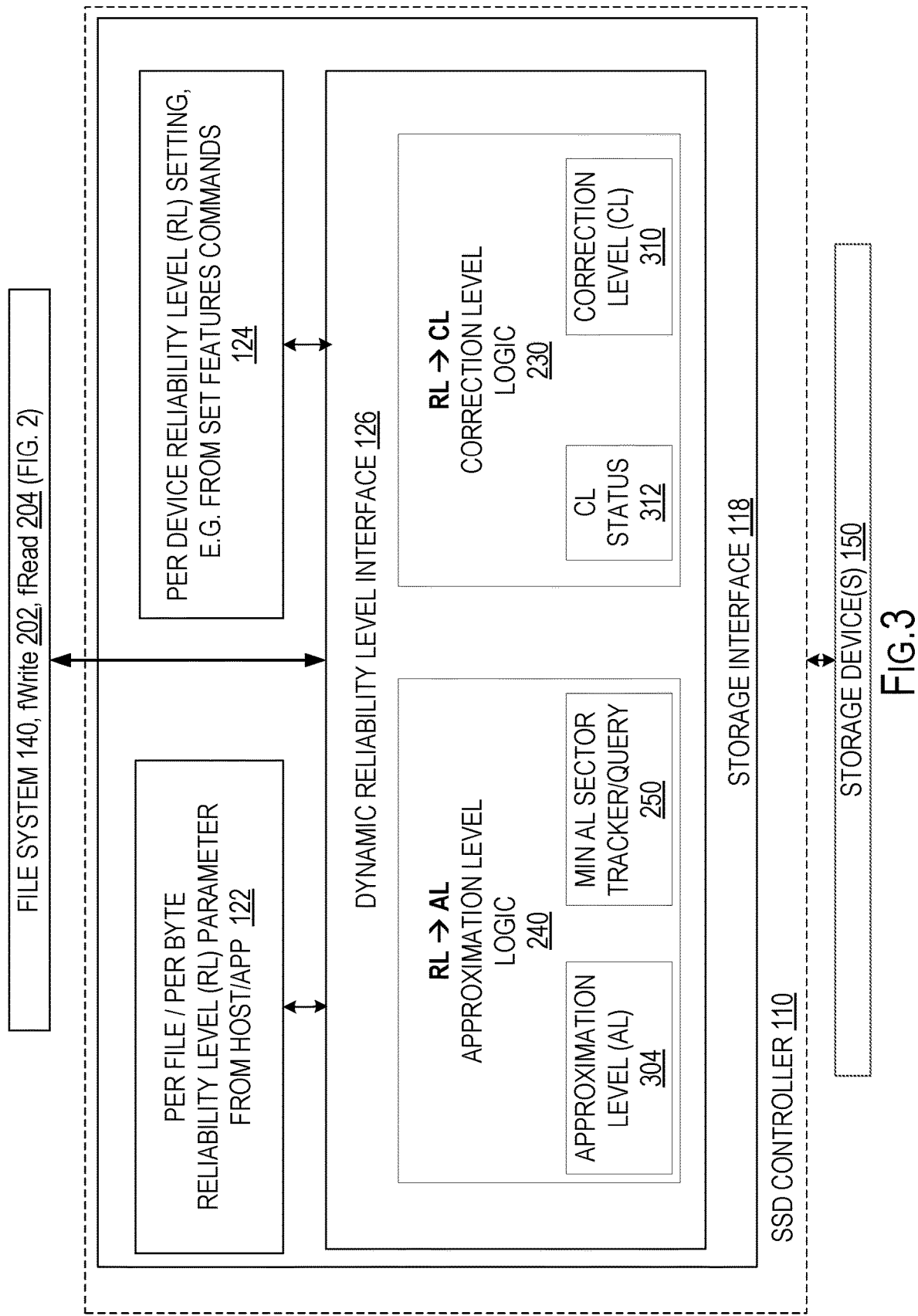
FIG. 3 is a schematic, block diagram illustration of further details of a system to implement dynamic reliability levels for non-volatile memory in accordance with various examples described herein.

FIG. 3 is a schematic, block diagram illustration of further details of a system to implement dynamic reliability levels for non-volatile memory. The file system 140 is in communication with an SSD controller 110 and storage device(s) 150 through a storage interface 118 that includes the dynamic reliability level interface 126 for managing host-specified RLs in file system requests. For example, the dynamic reliability level interface 126 receives a per file/per byte reliability level (RL) parameter 122 from a host application, such as in the fWrite 202 and fRead 204 file system requests. In one embodiment, the dynamic reliability level interface 126 receives a per device RL setting 124, such as might be received from a set features command for SSD controller 110 and associated storage devices 150. In one embodiment, the dynamic reliability level interface 126 is configured to convert the received host-specified RL contained in the file system requests into an approximation level (AL) 304 used to control storing data with more or less precision. After the SSD controller 110 satisfies a request, the dynamic reliability level interface 126 continues with any other host-specified RL processing, such as any correction level processing as described herein. In one embodiment, the dynamic reliability level interface 126 is configured to convert the received RL into a correction level (CL) 310 used to control storing data with more or less accuracy. After the SSD controller 110 satisfies a request, the dynamic reliability level interface 126 returns a CL status indicator 312 to the file system 140 for return to the host application that initiated the fWrite 202 and fRead 204 file system requests. In one embodiment, the dynamic reliability level interface 126 is configured to convert the received RL into both of one or more ALs 304 and CLs 310, since storing data with varying levels of accuracy can be combined with storing data with varying levels of precision, and either way of storing data with a host-specified RL can be combined with an ECC protection scheme.

Figure 4:
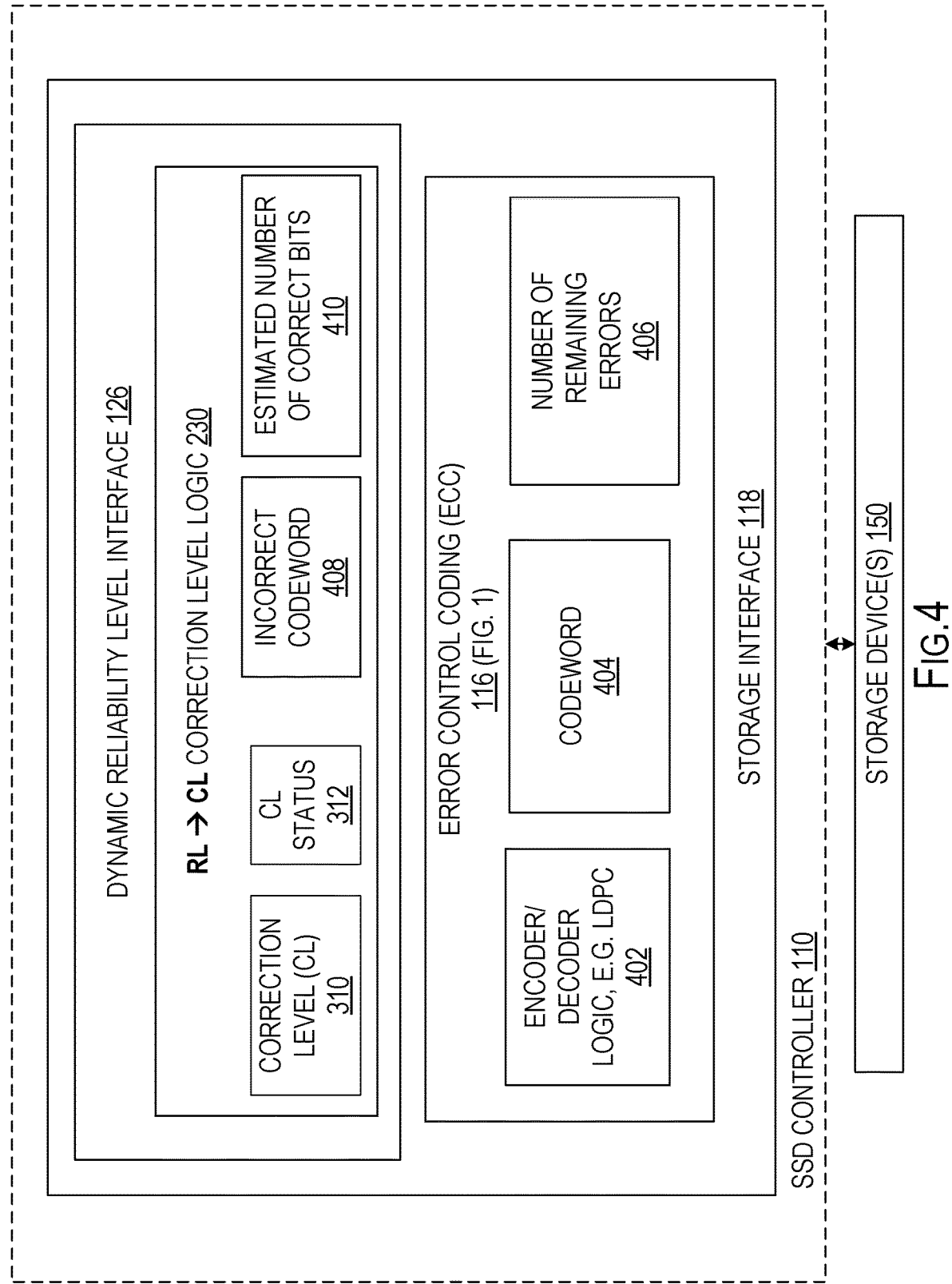
FIG. 4 is a schematic, block diagram illustration of further details of a system to implement dynamic reliability levels for non-volatile memory in accordance with various examples described herein.

FIG. 4 is a schematic, block diagram illustration of further details of a system to implement dynamic reliability levels for non-volatile memory, in particular dynamic RLs in the context of storing data with more or less accuracy using an ECC protection scheme. As previously described with reference to FIG. 3, The SSD controller 110 has a storage interface 118 that includes a dynamic reliability level interface 126 to convert a host-specified RL into a CL 310 for storing data with more or less accuracy, such as storing data using an ECC protection scheme 116. For example, in one embodiment, the converted CL 310 is used as a parameter for tuning the ECC protection scheme 116 to control the error probability exhibited by the data stored and retrieved using an encoder/decoder logic employed by the ECC 116.

An SSD controller 110 may comprise or be communicatively coupled to an ECC protection scheme 116 configured with multiple tiers of decoding and encoding, including LDPC logic 402, to encode and decode codewords that comprise the data being stored or retrieved in storage device(s) 150. For example, during a file system fWrite the application's data contained in the file system request is input to the LDPC logic 402, which encodes it into an LDPC codeword in accordance with a CL, where the CL controls the layers of encoding that are employed, and thus controls the error probability of the resulting codeword. During a subsequent retrieval, the LDPC logic 402 decodes the codewords to correct any potential errors (such as errors caused by physical media failures), again in accordance with a CL. Any incorrect codeword 408, i.e., codewords for which the error probability is not zero, is returned along with an estimate of the number of errors in a codeword. For example, in one embodiment, the number of remaining errors can be bounded using the following equation, $$\text{\#REMERRORS} \leq \frac{\text{Syndrome\_Weight}}{k}$$

where k is a parameter determined during error simulation with an H matrix, where the H matrix is a parity check matrix, and the syndrome-weight refers to the bit-weight of the error syndrome, which is the product of codeword and H-matrix.

In one embodiment, the dynamic reliability level interface 126 derives the estimated number of correct bits 410 in the codeword from the number of remaining errors 406 tracked by the ECC 116/LDCP logic 402. The estimated number of correct bits 410 is returned to the application that initiated the file system request via the file system and the dynamic reliability level interface 126 along with a CL status 312 and any incorrect codeword 408 that still contains the incorrect bits that could not be corrected at the current CL 310.

Figure 5:
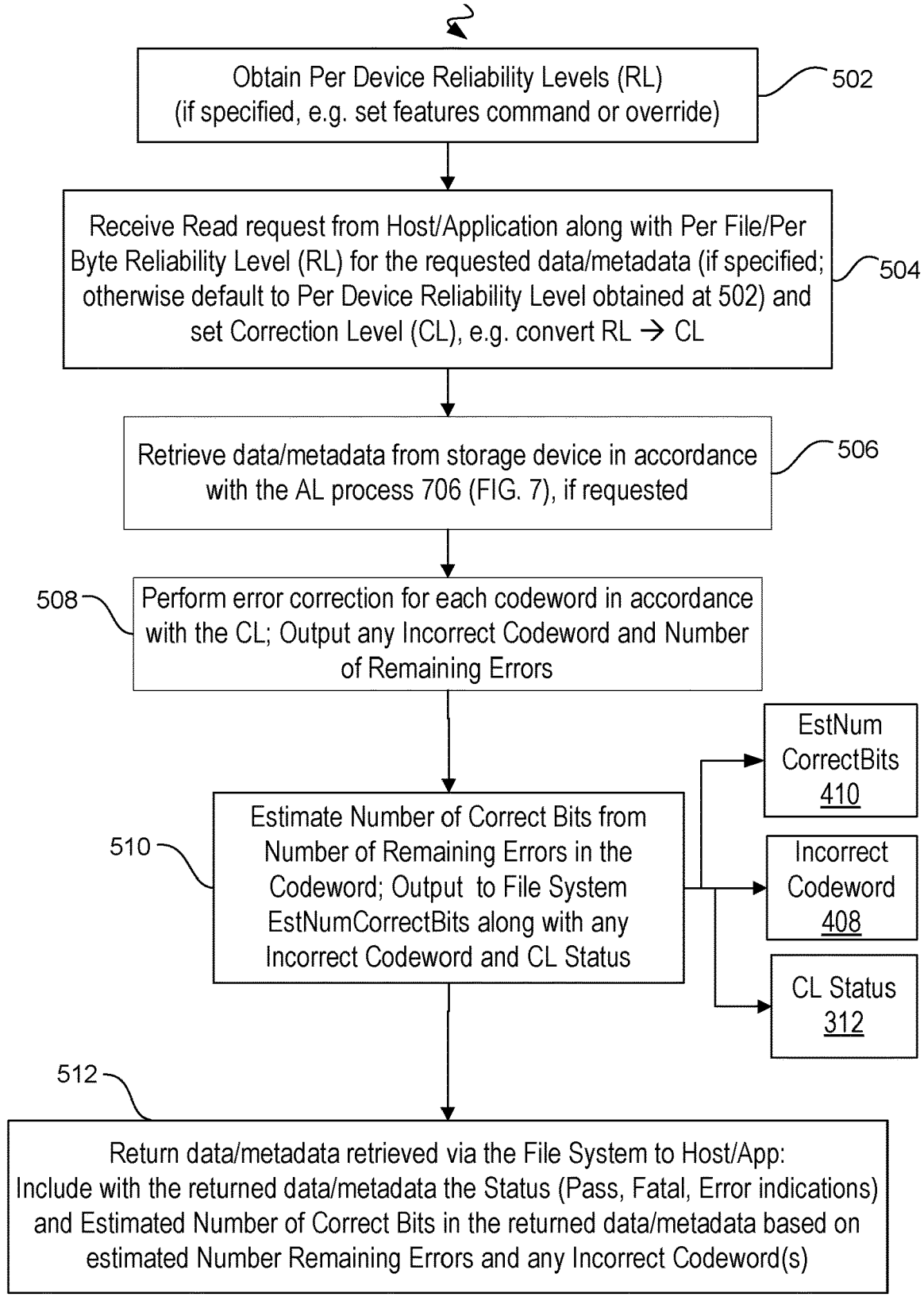
FIGS. 5, 6, 7 and 8A-8B are flow diagrams illustrating embodiments of processes performed to implement dynamic reliability levels for non-volatile memory in accordance with various examples described herein.
Figure 6:
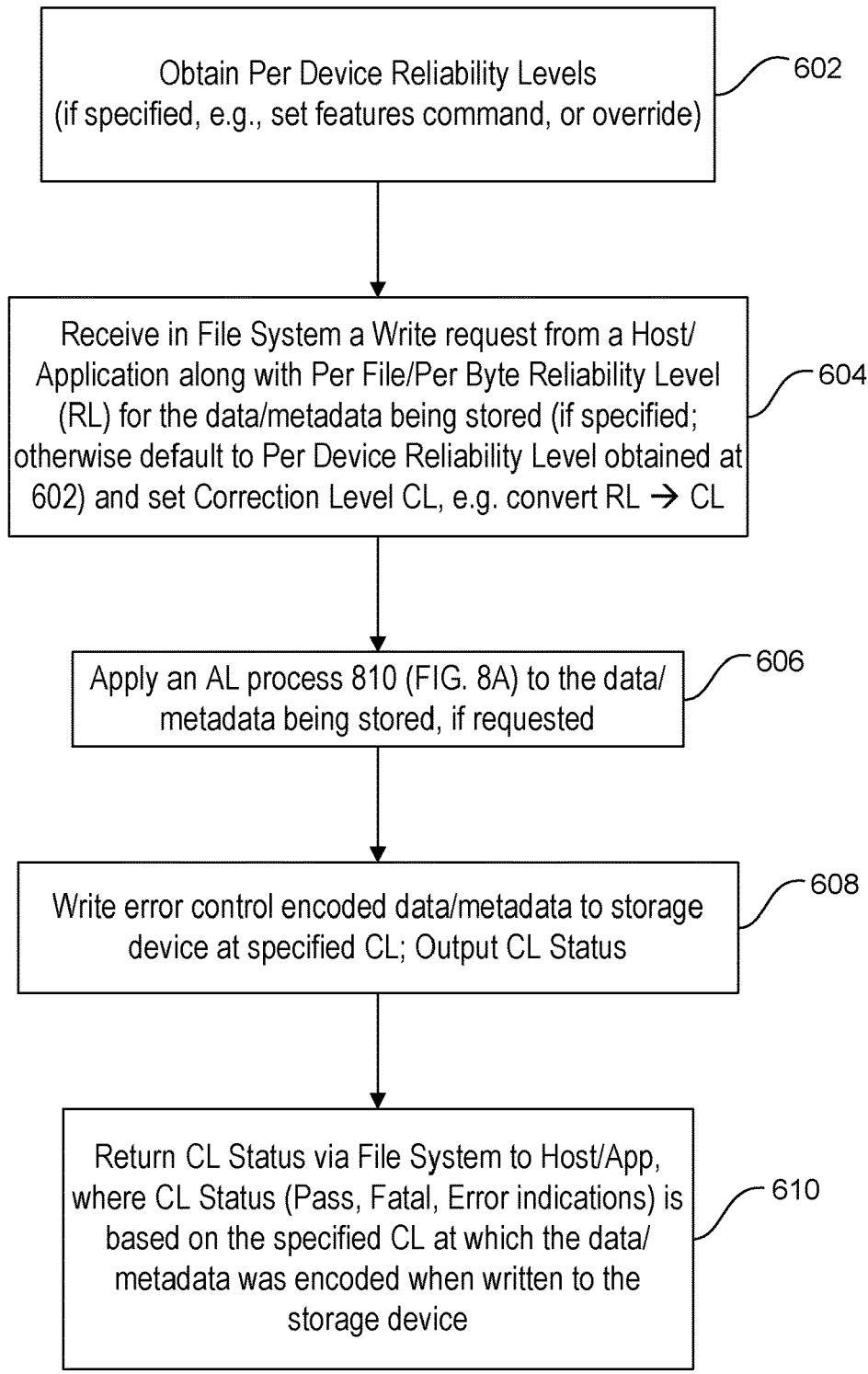

FIGS. 5-6 are flow diagrams illustrating embodiments of processes 500 and 600 performed to implement a dynamic reliability level interface 126 in the context of converting a host-specified RL to an CL in accordance with various examples described herein. With reference to FIG. 5, a read process flow 500 obtains 502 any per device RL that have been set for the storage devices for which dynamic reliability levels are enabled. The per device RL functions as a default setting for any file system requests that do not provide a host-specified RL and is typically a setting that defaults to the highest level of reliability, e.g. a "0" or "10" or some other value that will translate into ALs or CLs or other settings that will cause the SSD controller to store data with the highest degree of data fidelity that the storage devices under its control can provide, such as data encoded and decoded to exhibit the lowest probability of error.

In one embodiment, process 500 receives 504 a read request from a host application along with a per file or per byte RL for the data or metadata, or any other portion of data to be retrieved from storage. Process 500 converts the host-specified (or default) RL into a CL to control how accurately the data is read from storage for which an ECC protection scheme is employed. For example, for storage devices with available levels of correction ranging from CL 0 for the least correction/least accuracy and highest probability of error to CL 6 for the most correction/most accuracy and lowest probability of error, a host-specified RL value of 0 could be converted to CL 0 for the least accurate data retrieval and an RL 6 could be converted to CL 6 for the most accurate data retrieval. At 506, the storage system retrieves the requested data/metadata or other portion of data requested by the host application in accordance with an AL process as needed, such as the AL process described with reference to FIG. 7. At 508, the storage system performs the ECC process (FIG. 4) for each codeword comprising the data in accordance with the CL, where the CL controls the error probability exhibited in the retrieved data. The storage system outputs any incorrect codeword(s) 408 and the number of remaining errors 406 (FIG. 4) in the incorrect codeword(s) comprising the retrieved data. At 510, the storage system estimates the number of correct bits 410 from the number of remaining errors in the codeword(s) and outputs the incorrect codeword(s) 408 and CL status 312, where the CL status is used to indicate whether the ECC process completed with PASS, FATAL or ERROR status. The CL status reflects the success or failure of decoding the retrieved data/metadata using the ECC process with the converted CL as determined from the host application's specified RL. At 512, the retrieved data/metadata is returned via the file system to the host application along with the CL status 312, the estimated number of correct bits 410 and any incorrect codeword(s) 408.

With reference to FIG. 6, similar to the read process described above, a write process 600 obtains 602 any per device RLs that have been set for the storage devices for which dynamic reliability levels are enabled. The per device RL functions as a default setting for any file system requests that do not provide a host-specified RL and is typically a setting that defaults to the highest level of reliability, e.g. a "0" or "10" or some other value that will translate into ALs or CLs or other settings that will cause the SSD controller to store data with the highest degree of data fidelity that the storage devices under its control can provide, such as data encoded and decoded to exhibit the lowest probability of error.

In one embodiment, process 600 receives 604 a write request from a host application along with a per file or per byte RL for the data or metadata, or any other portion of data being stored. Process 600 converts the host-specified (or default) RL into a CL to control how accurately the data is stored in a storage device from which an ECC protection scheme is employed. Using the same example as for the read request in FIG. 5, for storage devices having 7 available levels of correction ranging from CL 0 for the least correction/least accuracy and highest probability of error to CL 6 for the most correction/most accuracy and lowest probability of error, a host-specified RL value of 0 could be converted to CL 0 for the least accurate data storage and an RL 6 could be converted to CL 6 for the most accurate data storage. At 606, the storage system applies an AL process to the data/metadata or other portion of data requested by the host application as needed, such as the AL process described with reference to FIG. 8A. At 608, the storage system stores the requested data/metadata or other portion of data requested by the host application using the ECC process (FIG. 4), encoding the data into codewords in accordance with the CL, where the CL controls the error probability exhibited by the stored data. The storage system outputs the CL status 312, where the CL status is used to indicate whether the ECC process completed with PASS, FATAL or ERROR status. The CL status reflects the success or failure of encoding the data/metadata the stored data/metadata using the ECC process with the converted CL as determined from the host application's specified RL. At 610, the CL status 312 is returned via the file system to the host application via the file system.

Figure 7:
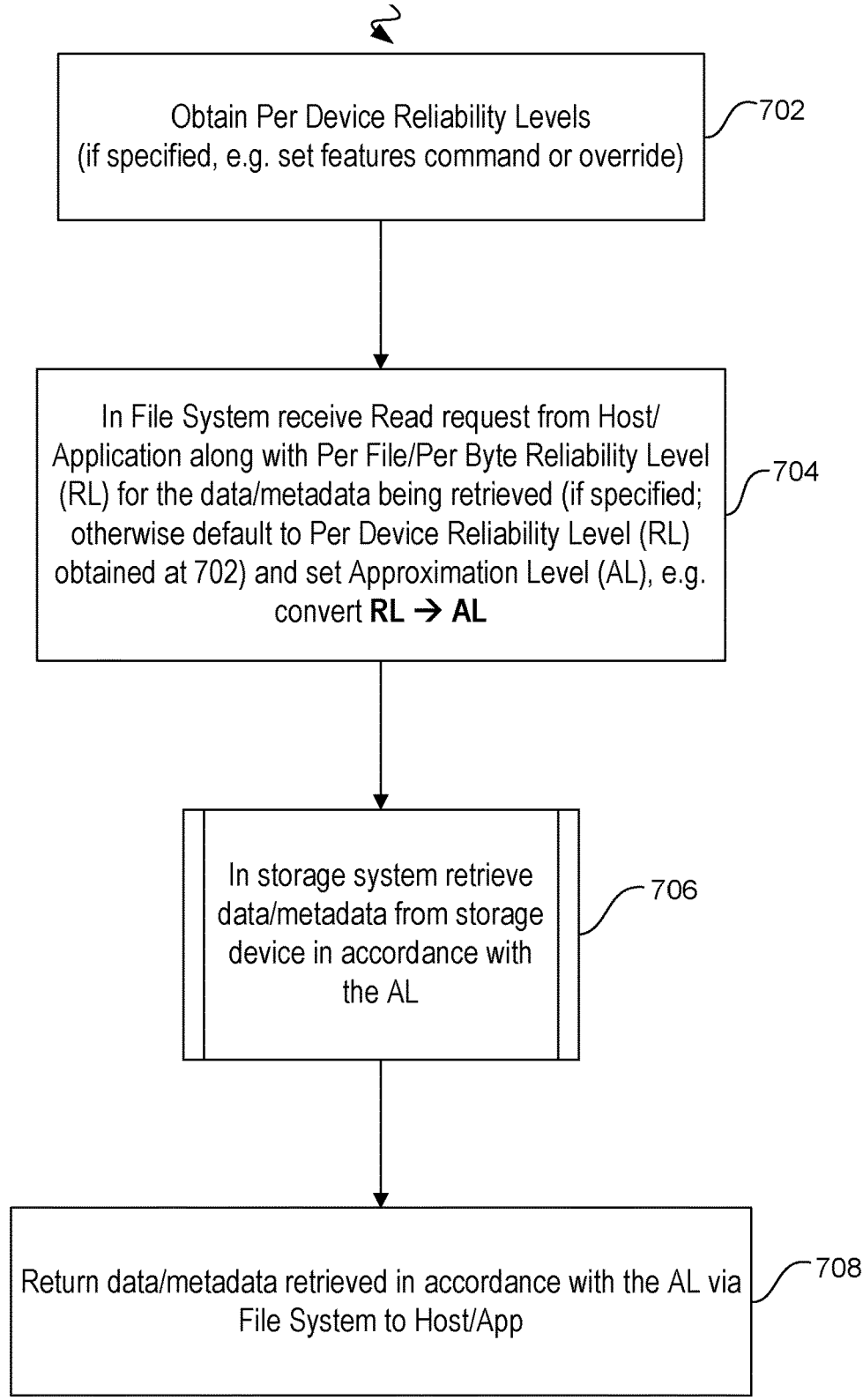

FIG. 7 is a flow diagram illustrating embodiments of processes performed to implement a dynamic reliability level interface 126 in the context of converting a host-specified RL to an AL in accordance with various examples described herein. Similar to the process 500, a read process flow 700 obtains 702 any per device RLs that have been set for the storage devices for which dynamic reliability levels are enabled. The per device RL functions as a default setting for any file system requests that do not provide a host-specified RL and is typically a setting that defaults to the highest level of reliability, in this case the highest degree of precision that a storage device under the control of an SSD controller can provide. For example, the highest degree of precision for a storage device could be exact storage, i.e., storing data with the most exact precision available on the device and/or at a location in the storage device that is capable of storing data with the most exact precision.

In one embodiment, process 700 receives 704 a read request from a host application along with a per file or per byte RL for the data or metadata, or any other portion of data to be retrieved from storage. Process 700 converts 704 the host-specified (or default if host did not specify) RL into an AL to control how precisely the data is read from storage in a storage device that is capable of storing and retrieving data with more or less precision. For example, for a storage device with 5 ALs ranging from 0 for retrieving data with exact precision to 4 for retrieving data with the least precision, a host-specified RL value of 0 could be converted to an AL value of 4. Conversely, a host-specified RL value of 4 could be converted to an AL value of 0 to retrieve data with exact precision. At 706, the storage system retrieves the requested data/metadata or other portion of data requested by the host application in accordance with the AL, where the AL controlled the precision with which the data was previously stored and/or with which the data is to now be retrieved. At 708, the retrieved data/metadata is returned via the file system to the host application.

Figure 8A:
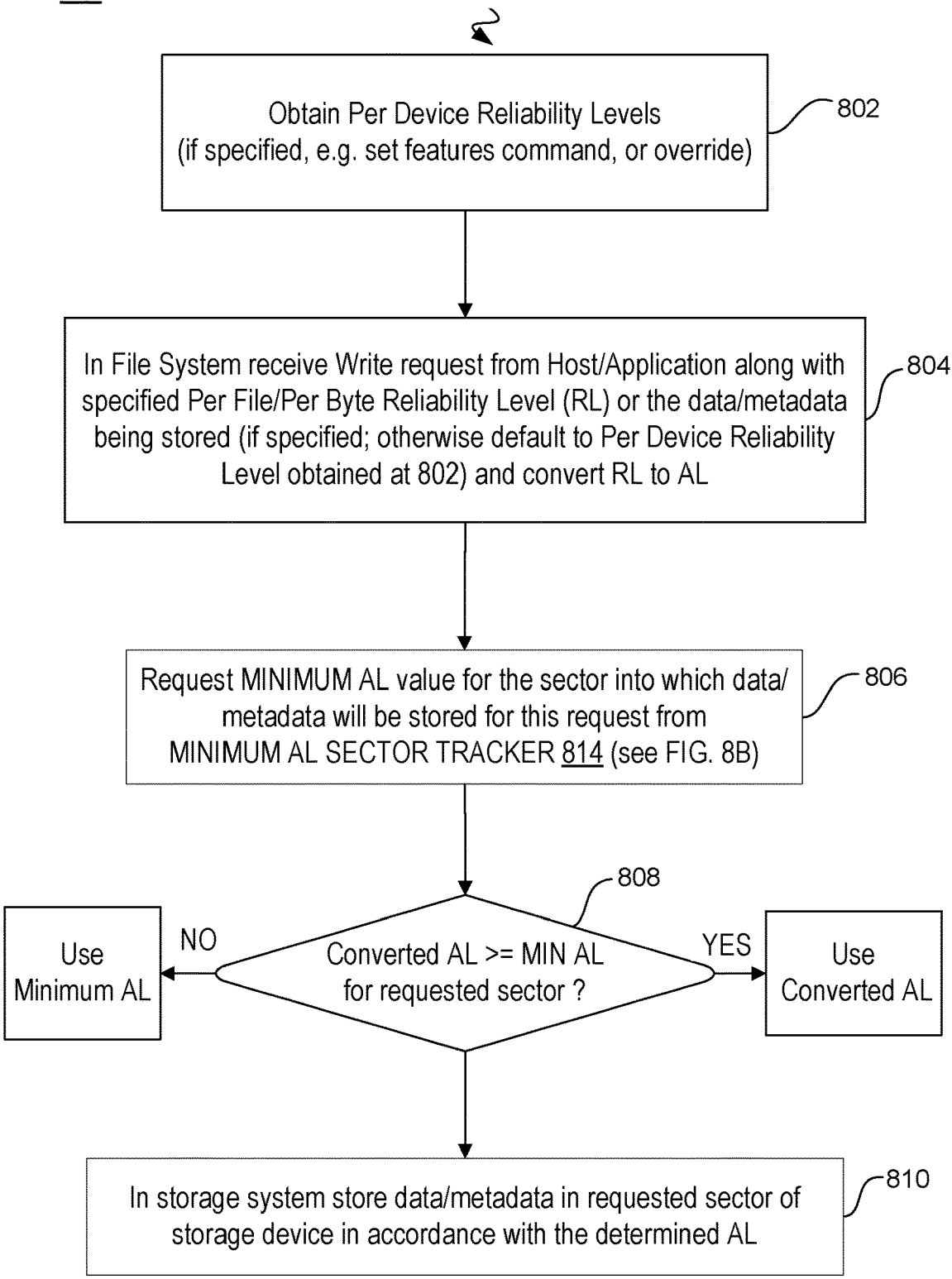

FIG. 8A is a flow diagram illustrating embodiments of processes performed to implement a dynamic reliability level interface 126 for storing data with more or less precision in accordance with various examples described herein. Similar to the read process in FIG. 7, a write process 800 obtains 802 any per device RLs that have been set for the storage devices for which dynamic reliability levels are enabled. The per device RL functions as a default setting for any file system requests that do not provide a host-specified RL and is typically a setting that defaults to the highest level of reliability to insure backwards compatibility with applications that do not make use of dynamic reliability levels and/or storage devices that cannot store and retrieve data at varying degrees of data fidelity. For example, the highest level of reliability for a storage device might be indicated with a "0" or other value if the device is capable of storing data with the highest degree of data fidelity, including storing data with exact precision as opposed to less precision.

In one embodiment, process 800 receives 804 a write request from a host application along with a per file or per byte host-specified RL for the data or metadata, or any other portion of data being stored. Process 800 converts the host-specified (or default if host did not specify) RL into an AL to control how precisely the data is stored in a storage device capable of storing and retrieving data with more or less precision. Using the same example as for the read request, for approximate storage with 5 ALs ranging from 0 for storing data with exact precision to 4 for storing data with the least precision, a host-specified RL value of 0 could be converted to an AL value of 4 to store data with the least precision and thus the least reliability. Conversely, a host-specified RL value of 4 could be converted to an AL value of 0 to store data with exact precision and thus the most reliability.

By way of example only and not limitation, in one embodiment, at 806, the storage system requests a minimum AL value for a sector (or other physical location) into which the requested data/metadata will be stored. Each sector in approximate storage can only store data with the same or less precision than what has already been stored in that sector. Therefore, a host-application that specifies an RL that converts into an AL that represents greater precision (a lower AL value) than the precision with which other data is already stored in a sector must yield to being stored with less precision (a higher AL value) in that sector.

In one embodiment, the minimum AL value for a given sector (or other physical location in the storage device) can be determined from a query to a minimum AL sector tracker process 814 (FIG. 8B), as will be described in further detail below. At decision block 808, the storage controller determines whether the AL that was converted from the host-specified RL represents less precision than the minimum AL, i.e., whether it converts to a higher AL value than the minimum AL. If so, then the storage controller of the storage device can use the converted AL since it specifies storage with less precision. However, if the storage controller determines that the host-specified AL represents greater precision than the minimum AL, i.e. converts to a lower AL value than the minimum AL, then the storage controller must instead use the minimum AL. At 810, the storage controller stores the requested data/metadata in the requested sector of the storage device in accordance with the determined AL, and continues with any other host-specified RL processing such as the correction level processing described herein.

Figure 8B:
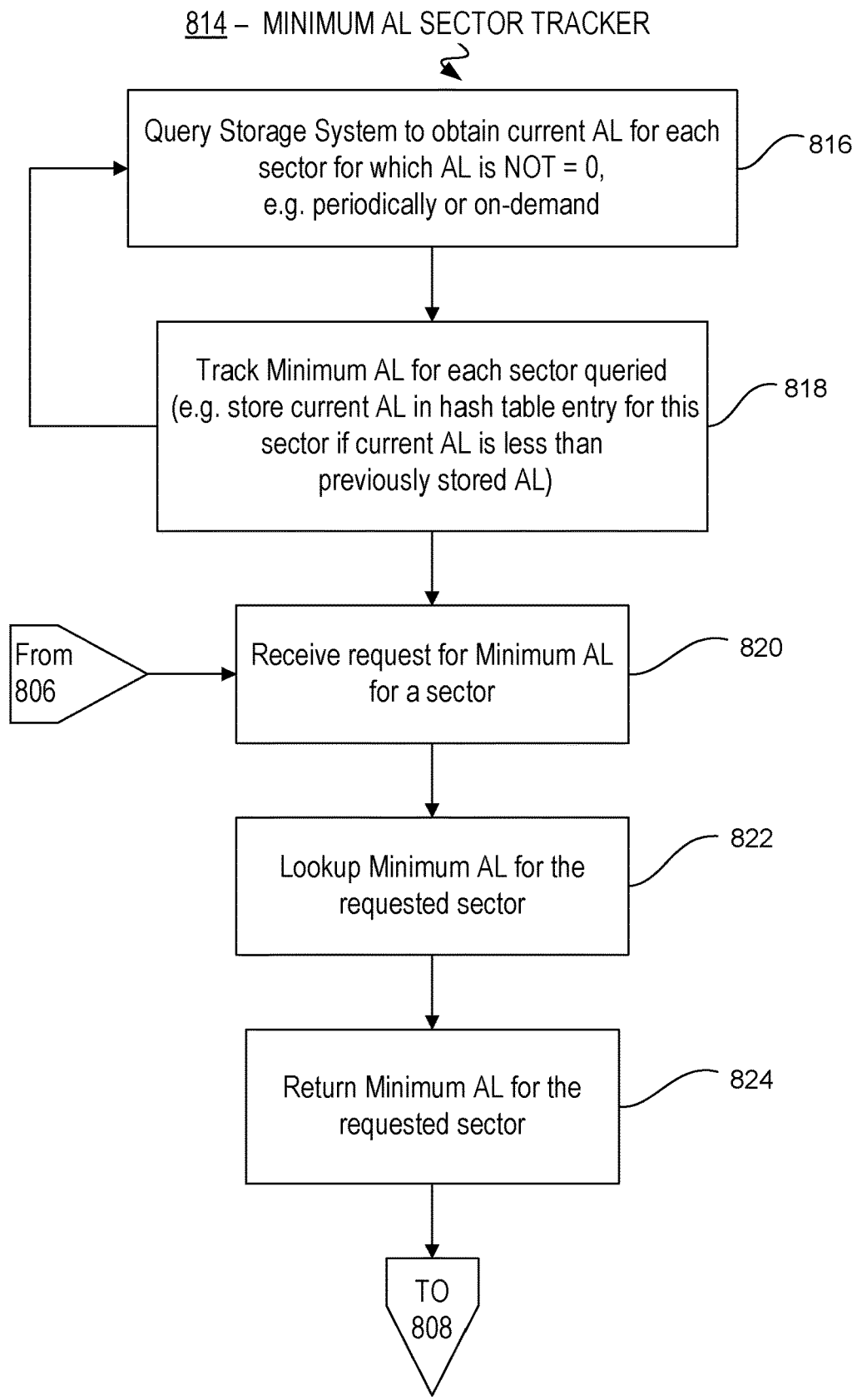

FIG. 8B is a flow diagram illustrating embodiments of processes performed to implement a dynamic reliability level interface 126 to store data in storage devices capable of storing data with more or less precision in accordance with various examples described herein. Process 814 represents the above-described minimum AL sector tracker first referenced in FIG. 8A. In one embodiment the process begins at 816 by querying the storage device(s) to obtain a current AL for each sector for which the AL is not equal to zero, i.e., each sector that is not exact storage, but rather stores data using approximate storage at less than exact precision. Querying the storage device(s) for the current AL can be performed periodically or on demand in response to a request. At 818, the process tracks the minimum AL for each of the queried sectors. For example, the process can store the current AL in a hash table entry for this sector if the current AL is less than the sector's previously stored AL. If the current AL is greater than the sector's previously stored AL, then the previously stored AL is maintained. The minimum AL value represents the greatest precision with which data can be stored in that sector.

In one embodiment, responsive to a request for the minimum AL for a sector (806, FIG. 8A), the process continues at 822 to lookup the minimum AL for the requested sector, for example performing a lookup on the hash table entries created at 818. At 824, the process returns the minimum AL for the requested sector to the process that requested it, 808 (FIG. 8A).

Figure 9:
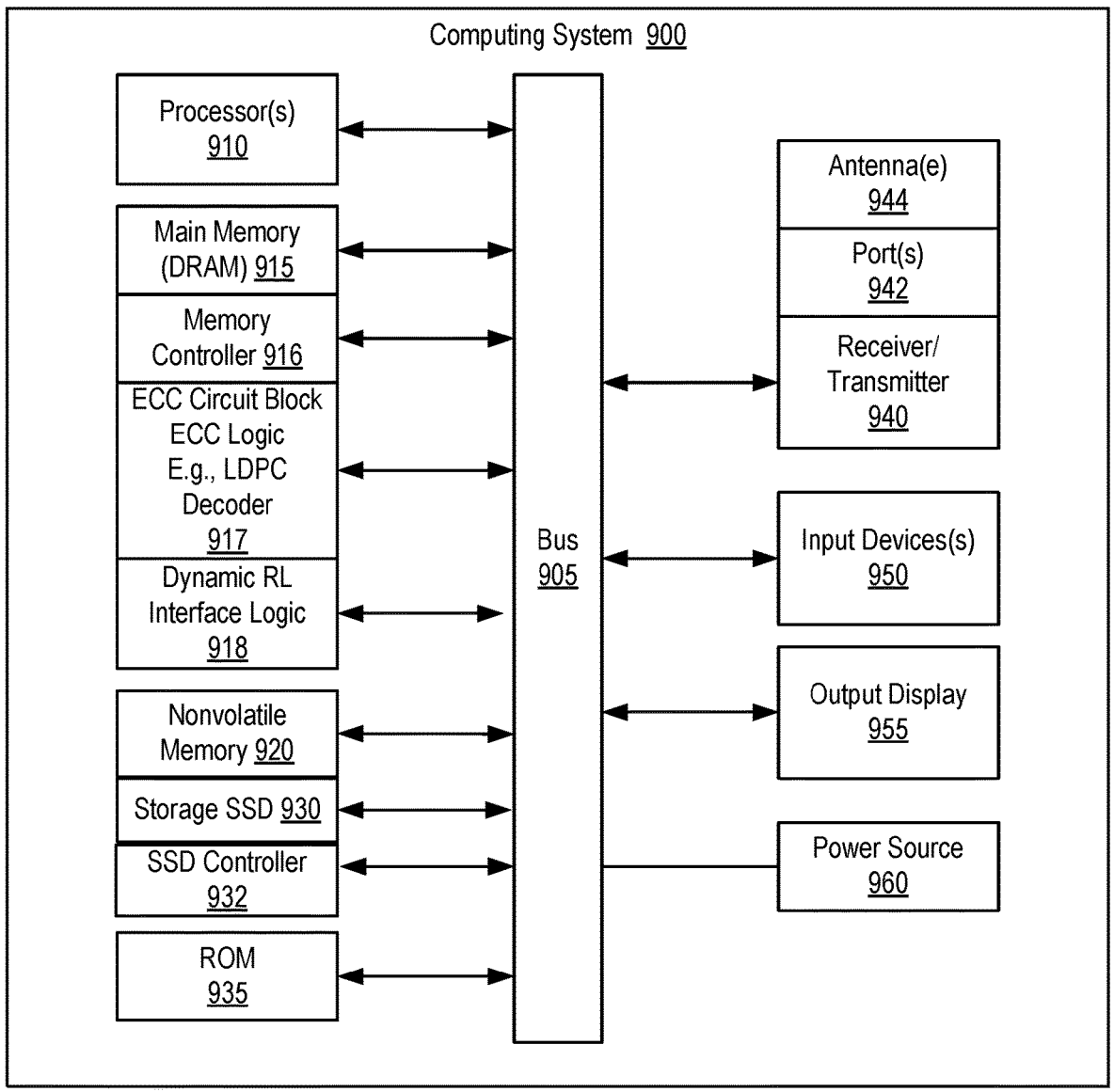
FIG. 9 illustrates an example of a typical computer system in which embodiments of dynamic reliability levels for non-volatile memory could be implemented, either in whole or in part, in accordance with various examples described herein.

FIG. 9 is an illustration of a system in which dynamic reliability levels for non-volatile memory can be implemented according to an embodiment. In this illustration, certain standard and well-known components that are not germane to the present description are not shown. Elements shown as separate elements may be combined, including, for example, a SoC (System on Chip) combining multiple elements on a single chip.

In some embodiments, a computing system 900 may include a processing means such as one or more processors 910 coupled to one or more buses or interconnects, shown in general as bus 905. The processors 910 may comprise one or more physical processors and one or more logical processors. In some embodiments, the processors may include one or more general-purpose processors or special-purpose processors.

The bus 905 is a communication means for transmission of data. The bus 905 is illustrated as a single bus for simplicity but may represent multiple different interconnects or buses and the component connections to such interconnects or buses may vary. The bus 905 shown in FIG. 9 is an abstraction that represents any one or more separate physical buses, point-to-point connections, or both connected by appropriate bridges, adapters, or controllers.

In some embodiments, the computing system 900 further comprises a random access memory (RAM) or other dynamic storage device or element as a main memory 915 and memory controller 916 for storing information and instructions to be executed by the processors 910. Main memory 915 may include, but is not limited to, dynamic random access memory (DRAM). In some embodiments, the RAM or other dynamic storage device or element includes an ECC circuit block implementing an ECC circuit logic 917 to provide one or more tiers of decoders, including, for example, an LDPC decoder for encoding and decoding data for probabilistic storage. In one embodiment, the RAM or other dynamic storage device or element includes a dynamic reliability level (RL) interface logic 918, such as the above-described dynamic reliability level interface 126 of FIG. 1, where the dynamic RL interface logic 918 facilitates dynamic reliability levels for storing data at varying degrees of data fidelity, including storing data in any one or more of approximate storage using approximation levels and in probabilistic storage using correction levels as described herein.

The computing system 900 also may comprise a non-volatile memory 920 of a storage device such as a solid-state drive (SSD) 930 and SSD Controller 932; and a read only memory (ROM) 935 or other static storage device for storing static information and instructions for the processors 910.

In some embodiments, the computing system 900 includes one or more transmitters or receivers 940 coupled to the bus 905. In some embodiments, the computing system 900 may include one or more antennae 944, such as dipole or monopole antennae, for the transmission and reception of data via wireless communication using a wireless transmitter, receiver, or both, and one or more ports 942 for the transmission and reception of data via wired communications. Wireless communication includes, but is not limited to, Wi-Fi, Bluetooth™, near field communication, and other wireless communication standards.

In some embodiments, computing system 900 includes one or more input devices 950 for the input of data, including hard and soft buttons, a joy stick, a mouse or other pointing device, a keyboard, voice command system, or gesture recognition system.

In some embodiments, computing system 900 includes an output display 955, where the output display 955 may include a liquid crystal display (LCD) or any other display technology, for displaying information or content to a user. In some environments, the output display 955 may include a touch-screen that is also utilized as at least a part of an input device 950. Output display 955 may further include audio output, including one or more speakers, audio output jacks, or other audio, and other output to the user.

The computing system 900 may also comprise a battery or other power source 960, which may include a solar cell, a fuel cell, a charged capacitor, near field inductive coupling, or other system or device for providing or generating power in the computing system 900. The power provided by the power source 960 may be distributed as required to elements of the computing system 900.

It will be apparent from this description that aspects of the described embodiments could be implemented, at least in part, in software. That is, the techniques and methods described herein could be carried out in a data processing system in response to its processor executing a sequence of instructions contained in a tangible, non-transitory memory such as the memory 915 or the non-volatile memory 920 or a combination of such memories, and each of these memories is a form of a machine readable, tangible storage medium.

Hardwired circuitry could be used in combination with software instructions to implement the various embodiments. For example, aspects of the described embodiments can be implemented as software installed and stored in a persistent storage device, which can be loaded and executed in a memory by a processor (not shown) to carry out the processes or operations described throughout this application. Alternatively, the described embodiments can be implemented at least in part as executable code programmed or embedded into dedicated hardware such as an integrated circuit (e.g., an application specific IC or ASIC), a digital signal processor (DSP), a field programmable gate array (FPGA), or controller which can be accessed via a corresponding driver and/or operating system from an application. Furthermore, the described embodiments can be implemented at least in part as specific hardware logic in a processor or processor core as part of an instruction set accessible by a software component via one or more specific instructions.

Thus the techniques are not limited to any specific combination of hardware circuitry and software or to any particular source for the instructions executed by the data processing system.

All or a portion of the described embodiments can be implemented with logic circuitry, such as the above-described ASIC, DSP or FPGA circuitry, including a dedicated logic circuit, controller or microcontroller, or other form of processing core that executes program code instructions. Thus processes taught by the discussion above could be performed with program code such as machine-executable instructions that cause a machine that executes these instructions to perform certain functions. In this context, a "machine" is typically a machine that converts intermediate form (or "abstract") instructions into processor specific instructions (e.g. an abstract execution environment such as a "virtual machine" (e.g. a Java Virtual Machine), an interpreter, a Common Language Runtime, a high-level language virtual machine, etc.), and/or, electronic circuitry disposed on a semiconductor chip (e.g. "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture can be used to store program code. An article of manufacture that stores program code can be embodied as, but is not limited to, one or more memories (e.g. one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g. a server) to a requesting computer (e.g. a client) by way of data signals embodied in a propagation medium (e.g. via a communication link (e.g. a network connection)).

The term "memory" as used herein is intended to encompass all volatile storage media, such as dynamic random access memory (DRAM) and static RAM (SRAM) or other types of memory described elsewhere in this application. Computer-executable instructions can be stored on non-volatile storage devices, such as magnetic hard disk, an optical disk, and are typically written, by a direct memory access process, into memory during execution of software by a processor. One of skill in the art will immediately recognize that the term "machine-readable storage medium" includes any type of volatile or non-volatile storage device that is accessible by a processor.

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The described embodiments also relate to an apparatus for performing the operations described herein. This apparatus can be specially constructed for the required purpose, or it may comprise a general-purpose computer selectively activated or reconfigured by a computer program stored in the computer. Either way, the apparatus provides the means for carrying out the operations described herein. The computer program can be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems can be used with programs in accordance with the teachings herein, or it may prove convenient to construct a more specialized apparatus to perform the operations described. The required structure for a variety of these systems will be evident from the description provided in this application. In addition, the embodiments are not described with reference to any particular programming language. It will be appreciated that a variety of programming languages could be used to implement the teachings of the embodiments as described herein.

In the foregoing specification, embodiments have been described with reference to specific exemplary embodiments. It will be evident that various modifications could be made to the described embodiments without departing from the broader spirit and scope of the embodiments as set forth in the following claims. The specification and drawings are, accordingly, to be regarded in an illustrative sense rather than a restrictive sense.

What is claimed is:

1. An apparatus comprising:
a storage controller to control a storage device at which data can be stored and retrieved with varying degrees of data fidelity in one or more storage devices capable of storing and retrieving data exhibiting a range of error probabilities;
an interface between the storage controller and a host in communication with the storage controller, the interface to expose two or more reliability levels corresponding to two or more of the varying degrees of data fidelity, the interface to include:
a plurality of error control code (ECC) correction levels (CLs), each ECC CL mapped to a reliability level corresponding to a degree of data fidelity at which data can be stored and retrieved, the degree of data fidelity within the range of error probabilities;
an ECC circuit block in communication with the storage controller, the ECC circuit block including an ECC logic circuitry to encode/decode codewords comprising the host's data in accordance with an ECC algorithm and one of the plurality of ECC CLs; and
wherein, responsive to receipt of a request from the host for any one of storing and retrieving data at a specified reliability level, the interface causes the storage controller to:
convert the host-specified reliability level to a corresponding degree of data fidelity at which the host's data can be stored and retrieved, and
command the storage device to satisfy the request at the corresponding degree of data fidelity to which the host-specified reliability level was converted, including to:

convert the host-specified reliability level to one of the plurality of ECC CLs based on the reliability levels to which the plurality of ECC CLs are mapped, return any incorrect codeword encountered by the storage device to the host, including an estimate of a number of correct bits present in an incorrect codeword, and return a status of the request to the host, the status indicating whether the storage device satisfied the request at the host-specified reliability level, including whether the storage device satisfied the request at the host-specified reliability level from which the ECC CL was converted.

2. The apparatus of claim 1, wherein the interface exposing two or more reliability levels corresponding to two or more of the varying degrees of data fidelity at which data can be stored and retrieved is based on a mapping between the two or more reliability levels and available degrees of data fidelity for storing and retrieving data in one or more storage devices under the control of the storage controller.

3. The apparatus of claim 1, wherein the data for which the host requests the specified reliability level can be one or more units of data, including any one or more bytes of data, metadata, a record, a file, and any other portion of data for which the host has determined a separate reliability level is to be requested.

4. The apparatus of claim 1, wherein data can be stored and retrieved with varying degrees of data fidelity in one or more storage devices capable of storing and retrieving data within a range of precision.

5. The apparatus of claim 4, wherein the interface causing the storage controller to satisfy the request at the corresponding degree of data fidelity to which the host-specified reliability level was converted includes:

a plurality of approximation levels (ALs), each AL mapped to a reliability level corresponding to a degree of data fidelity at which data can be stored and retrieved within the range of precision;

an AL circuit block in communication with the storage controller, the AL circuit block including an AL tracker logic circuitry to track a minimum AL at which data can be stored and retrieved within a single sector of a storage device, the minimum AL specifying a current level of precision with which data can be stored and retrieved, the current level reflecting a greatest level of precision at which data is currently stored within the single sector; and further wherein the interface causes the storage controller to:

obtain the minimum AL for the single sector in which the host's data is to be stored and retrieved, convert the host-specified reliability level to an AL based on the reliability levels to which the ALs are mapped, default to the minimum AL as a determined AL when the converted AL is greater than or equal to the minimum AL, otherwise use the converted AL as the determined AL, command the storage device to satisfy the request using the determined AL, and return the status of the request to the host, the status indicating whether the storage device satisfied the request at the determined AL.

6. A computer-implemented method comprising:

providing an interface between a storage controller and a host in communication with the storage controller, the host capable of hosting one or more applications the storage controller capable of controlling a storage device at which data can be stored and retrieved with varying degrees of data fidelity, the varying degrees of data fidelity including:

a plurality of error control code (ECC) correction levels (CLs) capable of controlling how accurately data is any one of stored and retrieved using an ECC protection scheme to encode/decode codewords comprising the data in accordance with an ECC algorithm;

a plurality of approximation levels (ALs) capable of controlling any one or more of:

a precision with which data is stored and retrieved, wherein the precision is based on truncating one or more lower order bits of data representing a floating point number, and a type of physical media on which data is stored and retrieved, where the type of physical media is associated with a media reliability, including any one or more of single level cell (SLC), multi-level cell (MLC), triple-level cell (TLC) and quadruple-level cell (QLC) memory comprising NAND flash memory, each of the type of physical media associated with a different media reliability, and an available level of lossless/lossy compression with which data is stored and retrieved;

receiving via the interface from the host a reliability level corresponding to any of the varying degrees of data fidelity; and causing the storage controller to control the varying degrees of data fidelity at which data can be stored and retrieved in accordance with the corresponding reliability level, including returning via the interface to the host:

a status of how accurately data was any one of stored and retrieved using the ECC protection scheme using the ECC CL to which the reliability level was mapped, and any incorrect codeword in the data encountered by the storage device, including an estimate of a number of correct bits present in an incorrect codeword.

7. The computer-implemented method of claim 6, further comprising:

determining which of the varying degrees of data fidelity corresponds to the reliability level, including mapping available degrees of data fidelity for storing and retrieving data in one or more storage devices under the control of the storage controller to any one or more reliability levels received via the interface.

8. The computer-implemented method of claim 6, wherein the data for which the reliability level is received can be one or more units of data, including any one or more bytes of data, metadata, a record, a file, and any other portion of data for which the host has determined a separate reliability level is to be requested.

9. The computer-implemented method of claim 6, the method further comprising:

tracking a minimum AL at which data can be stored and retrieved within a single sector of a storage device, the minimum AL specifying a current level of precision with which data can be stored and retrieved, the current level reflecting a greatest level of precision at which data is currently stored within the single sector; and obtaining the minimum AL for the single sector in which the host's data is to be stored and retrieved including:

converting the received reliability level to an AL based on available degrees of data fidelity to which the reliability levels are mapped, defaulting to the minimum AL as a determined AL when the converted AL is greater than or equal to the minimum AL, otherwise use the converted AL as the determined AL, and causing the storage controller to control the varying degrees of data fidelity at which data can be stored and retrieved using the determined AL.

10. At least one machine readable medium comprising a plurality of instructions executable by a system to cause the system to:

provide an interface between a storage controller and a host in communication with the storage controller, the host capable of hosting one or more applications the storage controller capable of controlling a storage device at which data can be stored and retrieved with varying degrees of data fidelity, including:

a plurality of error control code (ECC) correction levels (CLs) capable of controlling how accurately data is any one of stored and retrieved using an ECC protection scheme to encode/decode codewords comprising the data in accordance with an ECC algorithm, and a plurality of approximation levels (ALs) capable of controlling any one or more of:

a precision with which data is stored and retrieved, wherein the precision is based on truncating one or more lower order bits of data representing a floating point number, and a type of physical media on which data is stored and retrieved, where the type of physical media is associated with a media reliability, and an available level of lossless/lossy compression with which data is stored and retrieved;

receive via the interface from the host a reliability level corresponding to any of the varying degrees of data fidelity;

cause the storage controller to control the varying degrees of data fidelity at which data can be stored and retrieved in accordance with the corresponding reliability level; and return via the interface to the host:

a status of how accurately data was any one of stored and retrieved using the ECC protection scheme using the ECC CL to which the reliability level was mapped; and any incorrect codeword in the data encountered by the storage device, including an estimate of a number of correct bits present in the incorrect codeword.

11. The at least one computer-readable medium of claim 10, wherein the plurality of instructions further cause the system to:

determine which of the varying degrees of data fidelity corresponds to the reliability level, including mapping available degrees of data fidelity for storing and retrieving data in one or more storage devices under the control of the storage controller to any one or more reliability levels received via the interface.

12. The at least one computer-readable medium of claim 10, wherein the data for which the reliability level is received can be one or more units of data, including any one or more bytes of data, metadata, a record, a file, and any other portion of data for which the host has determined a separate reliability level is to be requested.

13. The at least one computer-readable medium of claim 10, wherein the plurality of instructions further cause the system to:

track a minimum AL at which data can be stored and retrieved within a single sector of a storage device, the minimum AL specifying a current level of precision with which data can be stored and retrieved, the current level reflecting a greatest level of precision at which data is currently stored within the single sector; and obtain the minimum AL for the single sector in which the host's data is to be stored and retrieved, including to:

convert the received reliability level to an AL based on available degrees of data fidelity to which the reliability levels are mapped, default to the minimum AL as a determined AL when the converted AL is greater than or equal to the minimum AL, otherwise use the converted AL as the determined AL, and cause the storage controller to control the varying degrees of data fidelity at which data can be stored and retrieved using the determined AL.

\* \* \* \* \*